US011573258B1

(12) United States Patent
Gomez, Jr.

(10) Patent No.: US 11,573,258 B1
(45) Date of Patent: Feb. 7, 2023

(54) APPARATUS AND METHOD FOR TESTING INSULATED HIGH VOLTAGE DEVICES

(71) Applicant: Aptiv Technologies Limited, St. Michael (BB)

(72) Inventor: Pablo Andrei Hernandez Gomez, Jr., Chihuahua (MX)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 0 days.

(21) Appl. No.: 17/402,770

(22) Filed: Aug. 16, 2021

(51) Int. Cl.
*G01R 31/12* (2020.01)
*G01R 31/327* (2006.01)

(52) U.S. Cl.
CPC ..... *G01R 31/1272* (2013.01); *G01R 31/3272* (2013.01)

(58) Field of Classification Search
CPC .............. G01R 31/1272; G01R 31/3272
USPC ....................................... 324/512
See application file for complete search history.

(56) References Cited

U.S. PATENT DOCUMENTS

| 4,392,104 | A | | 7/1983 | Lewis et al. | |
|---|---|---|---|---|---|
| 5,132,629 | A | * | 7/1992 | Clinton | G01R 31/52 324/544 |
| 5,214,240 | A | * | 5/1993 | McArdle | G01R 31/16 174/15.1 |
| 5,241,277 | A | * | 8/1993 | Kefalas | G01R 31/69 324/538 |
| 6,566,887 | B2 | * | 5/2003 | Smith | G01R 31/58 324/544 |
| 9,664,716 | B1 | * | 5/2017 | Zelm | G01R 27/025 |
| 9,977,067 | B1 | * | 5/2018 | Zelm | G01R 27/025 |
| 10,782,357 | B1 | * | 9/2020 | Zelm | G01R 27/025 |
| 2001/0052778 | A1 | * | 12/2001 | Smith | G01R 31/1272 324/541 |

(Continued)

FOREIGN PATENT DOCUMENTS

CN 203337771 U * 12/2013
CN 206114838 U * 4/2017

(Continued)

OTHER PUBLICATIONS

Feldman, Jeffrey. "Low Voltage Electric Shock: Should you be concerned?" Jul. 24, 2020 (Year: 2020).*

(Continued)

*Primary Examiner* — Patrick Assouad
*Assistant Examiner* — Sean Curtis
(74) *Attorney, Agent, or Firm* — Billion & Armitage

(57) ABSTRACT

An apparatus for testing insulated high voltage devices includes a first ground plane connected to a reference voltage potential having a first plurality of resiliently compressible conductive fibers extending therefrom and a second ground plane connected to the reference voltage potential having a second plurality of resiliently compressible conductive fibers extending therefrom. The first and second ground planes are arranged to receive an insulated high voltage device under test connected to a voltage potential greater or less than the reference voltage potential between them and configured such that at least a portion of the first and second pluralities of resiliently compressible conductive fibers are in compressive contact with the insulated high voltage device under test. A method of testing insulated high voltage devices is also presented herein.

20 Claims, 4 Drawing Sheets

(56) References Cited

U.S. PATENT DOCUMENTS

| | | | |
|---|---|---|---|
| 2001/0054902 A1* | 12/2001 | Smith | G01R 31/58 |
| | | | 324/544 |
| 2003/0020484 A1* | 1/2003 | Clinton | H04B 3/46 |
| | | | 324/544 |
| 2005/0206393 A1* | 9/2005 | Carroll | G01R 31/59 |
| | | | 324/544 |
| 2009/0102486 A1 | 4/2009 | Purdy et al. | |
| 2013/0241571 A1* | 9/2013 | Oiwa | G01R 31/58 |
| | | | 324/543 |
| 2014/0266284 A1 | 9/2014 | Bruno | |
| 2016/0282403 A1 | 9/2016 | Hanawa | |
| 2016/0370415 A1 | 12/2016 | Carroll et al. | |

FOREIGN PATENT DOCUMENTS

| | | | | |
|---|---|---|---|---|
| CN | 111579892 B | * | 6/2021 | G01R 1/28 |
| DE | 102019210866 A1 | * | 1/2021 | G01R 31/16 |
| ES | 2813127 A1 | * | 3/2021 | G01R 31/1272 |
| FR | 3049351 A1 | * | 9/2017 | G01R 31/022 |
| FR | 3049351 B1 | * | 7/2019 | G01R 31/022 |
| GB | 1318793 A | | 5/1973 | |
| JP | 2005345465 A | * | 12/2005 | G01R 31/1272 |
| JP | 4841166 B2 | * | 12/2011 | G01R 31/1272 |
| WO | WO-2021013446 A1 | * | 1/2021 | G01R 31/16 |

OTHER PUBLICATIONS

English Translation of CN 206114838 U—Apr. 20, 17 (Year: 2017).*

Feldman, Jeffrey. "Low Voltage Electric Shock: Should you be concerned?" Jul. 2020 (Year: 2020).*

Extended European search report for Application No. 22182995.5; dated Dec. 20, 2022; 5 pages.

* cited by examiner

APPARATUS AND METHOD FOR TESTING INSULATED HIGH VOLTAGE DEVICES

This patent application is directed to an apparatus and method for testing devices used in a high voltage application (e.g., over 200 volts), particularly to an apparatus and method for testing the integrity of insulation of a high voltage device.

BACKGROUND

High voltage electrical devices, such as bus bars, wiring harnesses, or a combination thereof are preferably tested while energized with high voltage in contact with a ground plane to verify the integrity and adequacy of the electrical insulation on the device and ensure that no electrical arcs are generated due to insulation defects.

Prior means for performing such tests have involved various apparatuses and methods. A first example test apparatus includes machined metal plates acting as ground planes which surround the device under test. The metal plates are specially shaped to conform with the particular geometry of the device under test. Because these metal plates are customized for each device this first example test apparatus has the drawbacks of requiring separate ground planes that are specially configured for each unique device configuration under test along with the manufacturing costs and time for making each ground plane, and changes to the ground planes driven by engineering changes during the design cycle of the device under test. A second example test apparatus includes a chamber containing metal ball chains connected to ground that are arranged over and under the device under test. Since the metal ball chains under the device are noncompressible, this second example test apparatus is not well suited for inflexible devices, such as bus bars. A third example test apparatus is a metallic vacuum chamber in which the device under test is placed. The vacuum in the chamber increases the arc distance. This third example test apparatus has the drawbacks of requiring a sealed interface to test the device. The pneumatic features of the third example test apparatus have high costs for design, integration and maintenance. In addition, certain devices under test are not capable of withstanding the differential pressure needed. A fourth example test apparatus is a wand or cuff that replaces the ambient air around the device under test with an inert gas. This fourth example test apparatus is designed for manual use and has low test repeatability and therefore is unsuitable for regular high-volume production use.

SUMMARY

According to one or more aspects of the present disclosure, an apparatus for testing insulated high voltage devices includes a first ground plane connected to a reference voltage potential having a first plurality of resiliently compressible conductive fibers extending therefrom and a second ground plane connected to the reference voltage potential having a second plurality of resiliently compressible conductive fibers extending therefrom. The first and second ground planes are arranged to receive an insulated high voltage device under test connected to a voltage potential greater or less than the reference voltage potential between them and configured such that at least a portion of the first and second pluralities of resiliently compressible conductive fibers are in compressive contact with the insulated high voltage device under test.

In one or more embodiments of the apparatus according to the previous paragraph, the first and second pluralities of resiliently compressible conductive fibers are formed of metallic materials.

In one or more embodiments of the apparatus according to any one of the previous paragraphs, the first and second pluralities of resiliently compressible conductive fibers form spiral shapes.

In one or more embodiments of the apparatus according to any one of the previous paragraphs, the first and second pluralities of resiliently compressible conductive fibers are formed of a coarse metallic mesh.

In one or more embodiments of the apparatus according to any one of the previous paragraphs, the first and second pluralities of resiliently compressible conductive fibers are formed of a coarse stainless steel, copper, or brass wool material.

In one or more embodiments of the apparatus according to any one of the previous paragraphs, the first ground plane is connected to the second ground plane by an articulating hinge.

In one or more embodiments of the apparatus according to any one of the previous paragraphs, the reference voltage potential is a ground potential and wherein the voltage potential of the insulated high voltage device under test is at least 200 volts greater than the ground potential.

In one or more embodiments of the apparatus according to any one of the previous paragraphs, the apparatus further comprises an electrical connector electrically attaching the insulated high voltage device under test to the voltage potential that is disposed within an insulative shroud.

In one or more embodiments of the apparatus according to any one of the previous paragraphs, the electrical connector is configured to receive an uninsulated portion of the insulated high voltage device under test within the insulative shroud.

In one or more embodiments of the apparatus according to any one of the previous paragraphs, the electrical connector is a first electrical connector, and the apparatus further comprises a second electrical connector electrical attaching the insulated high voltage device under test to the voltage potential at a different location on the insulated high voltage device under test.

According to one or more aspects of the present disclosure, a method of testing insulated high voltage devices includes the steps of: providing a first ground plane having a first plurality of resiliently compressible conductive fibers extending therefrom and a second ground plane having a second plurality of resiliently compressible conductive fibers extending therefrom, connecting the first and second ground planes to a reference voltage potential, and connecting an insulated high voltage device under test connected to a voltage potential greater or less than the reference voltage potential.

In one or more embodiments of the method according to the previous paragraph, the method further includes the step of forming the first and second pluralities of resiliently compressible conductive fibers from metallic materials.

In one or more embodiments of the method according to any one of the previous paragraphs, the method further includes the step of forming the first and second pluralities of resiliently compressible conductive fibers into spiral shapes.

In one or more embodiments of the method according to any one of the previous paragraphs, the method further includes the step of forming the first and second pluralities of resiliently compressible conductive fibers from a coarse metallic mesh.

In one or more embodiments of the method according to any one of the previous paragraphs, the method further includes the step of forming the first and second pluralities of resiliently compressible conductive fibers from a coarse stainless steel, copper, or brass wool material.

In one or more embodiments of the method according to any one of the previous paragraphs, the method further includes the step of connecting the first ground plane to the second ground plane by an articulating hinge.

In one or more embodiments of the method according to any one of the previous paragraphs, the reference voltage potential is a ground potential and the voltage potential of the insulated high voltage device under test is at least 200 volts greater than the ground potential.

In one or more embodiments of the method according to any one of the previous paragraphs, the method further includes the steps of providing an electrical connector within an insulative shroud and electrically attaching the insulated high voltage device under test to the voltage potential via the electrical connector.

In one or more embodiments of the method according to any one of the previous paragraphs, the electrical connector is configured to receive an uninsulated portion of the insulated high voltage device under test within the insulative shroud.

In one or more embodiments of the method according to any one of the previous paragraphs, the method further includes the steps of providing a second electrical connector and electrically attaching the insulated high voltage device under test to the voltage potential at a different location on the insulated high voltage device under test via the second electrical connector.

DESCRIPTION OF THE DRAWINGS

The present invention will now be described, by way of example with reference to the accompanying drawings, in which.

DETAILED DESCRIPTION

Figure 1:
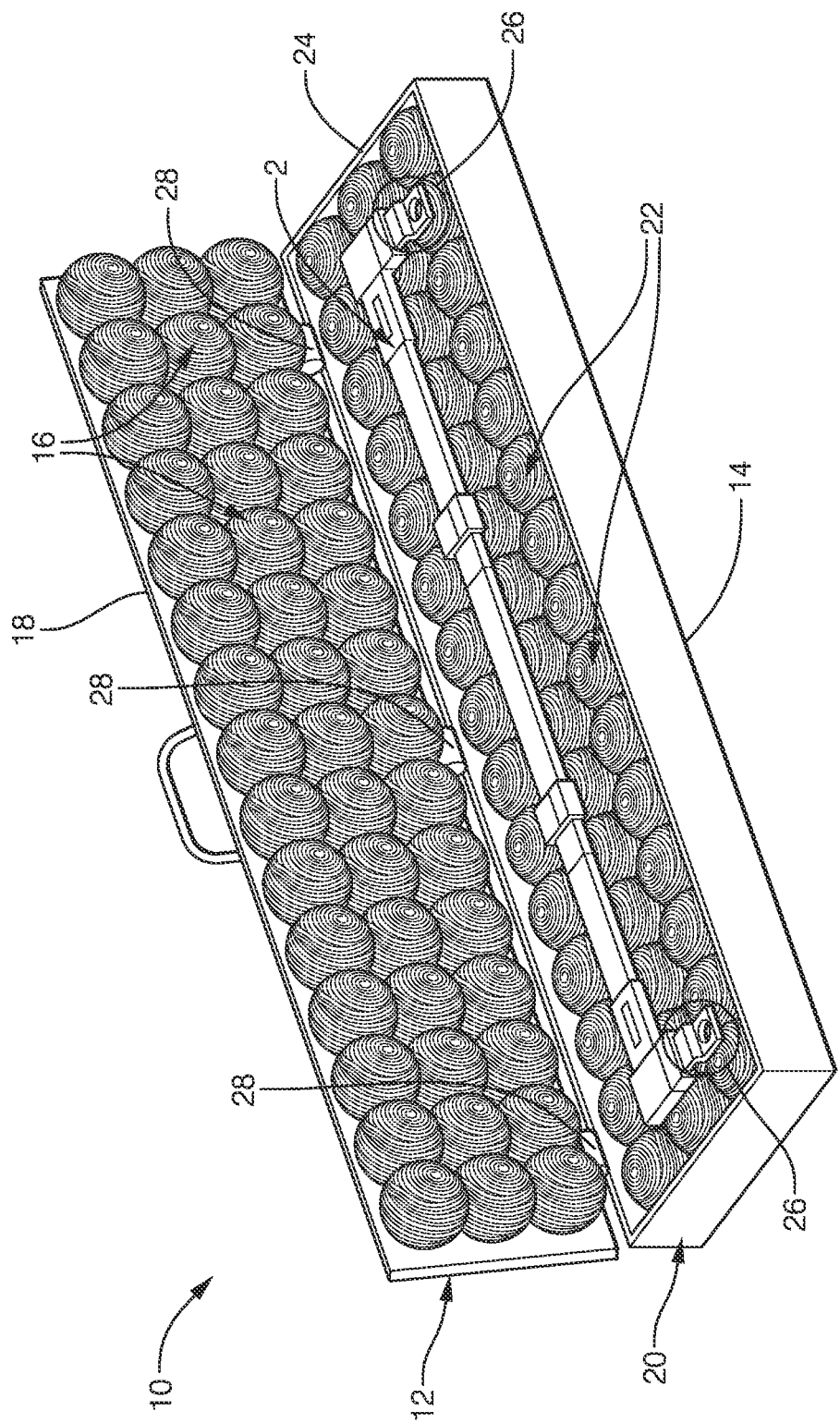
FIG. 1 is a perspective views of an apparatus for testing high voltage devices according to according to some embodiments.

A test apparatus and testing method that overcomes the drawbacks of previous means for high voltage insulation tests is presented herein.

The test apparatus 10 illustrated in FIG. 1 has a first ground plane, hereinafter referred to as the upper ground plane 12 that is connected to a reference voltage potential 14 e.g., ground potential. The upper ground plane 12 has a first plurality of resiliently compressible conductive fibers 16 extending from an upper ground plate 18. The test apparatus 10 also has a second ground plane, hereinafter referred to as the lower ground plane 20 that is also connected to the same reference voltage potential 14. The lower ground plane 20 has a second plurality of resiliently compressible conductive fibers 22 that extend from a lower ground plate 24. The upper and lower ground planes 12, 20 are arranged so as to receive an insulated high voltage device under test 2, such as an insulated bus bar, insulated cable, or insulated wiring harness between them. The device under test 2 is connected to a test voltage potential 26 that is greater or less than the reference voltage potential 14. The difference between the test voltage potential 26 and the reference voltage potential 14 may be at least 200 volts. The reference voltage potential 14 is preferably at ground potential and the test voltage potential 26 is greater than the ground potential. The upper ground plate 18 may have a planar configuration while the lower ground plate 24 may have a box-like configuration.

Figure 2A:
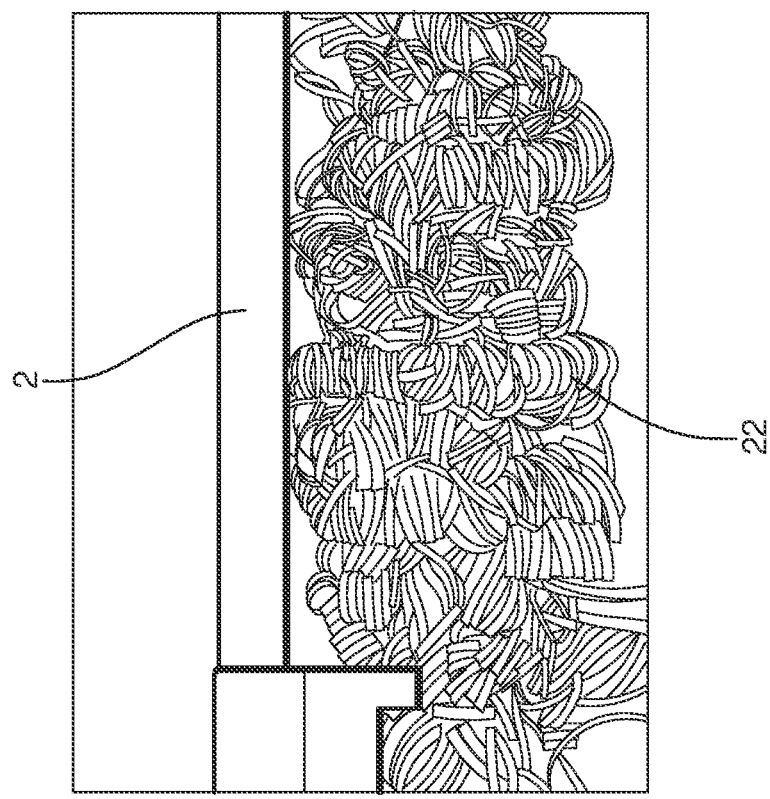
FIG. 2A is a side view of a high voltage device within the apparatus of FIG. 1 prior to compression of the high voltage device against the apparatus according to some embodiments.
Figure 2B:
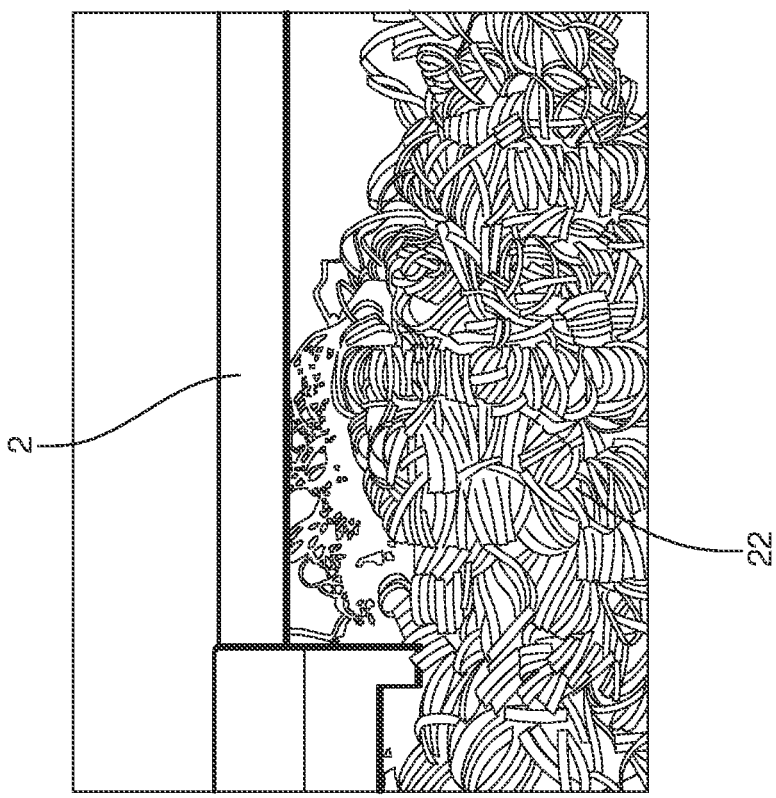
FIG. 2B is a side view of a high voltage device within the apparatus of FIG. 1 after compression of the high voltage device against the apparatus according to some embodiments.

As shown in FIGS. 2A and 2B, the upper and lower ground planes 12, 20 are configured such that at least a portion of the first and second pluralities of resiliently compressible conductive fibers 16, 22 are in compressive contact with the device under test 2 as shown in FIG. 2B.

As illustrated in FIGS. 1-2B, the first and second pluralities of resiliently compressible conductive fibers 16, 22 are formed of metallic materials, such as a coarse metallic mesh or a coarse stainless steel, copper, or brass wool material. In the illustrated example, the first and second pluralities of resiliently compressible conductive fibers 16, 22 form spiral spring-like shapes as best shown in FIGS. 2A, 2B. These spiral spring-like shaped fibers are then arranged into a spherical shape and electrically and mechanically attached to the upper and lower ground plates 18, 24. When these spiral shaped fibers are arranged into a spherical shape, they have been found to provide a large number of electrical contact points between the upper and lower ground planes 12, 20 and the device under test 2 as well as provide the resiliency to successfully test devices having different shapes. This is beneficial because this allows the test apparatus 10 to accommodate devices under test 2 of differing design, e.g., a bus bar vs. a wire cable, or devices under test having different shapes e.g., two flexible wiring harnesses having the same configuration but different shapes. The upper and lower ground plates 18, 24 are formed of sheets of a conductive metal, such as copper, aluminum, or stainless steel.

In the illustrated example of FIG. 1, the upper ground plane 12 is connected to the lower ground plane 20 by an articulating hinge 28. This articulating hinge 28 allows the device under test 2 to be laid on the lower ground plane 20, thereby putting the device under test 2 in contact with the lower ground plane 20 as shown in FIG. 2A and then allows the upper ground plane 12 to be moved into a position in which the upper ground plane 12 also contacts the device under test 2 and compresses the first and second pluralities of resiliently compressible conductive fibers 16, 22 as shown in FIG. 2B.

Figure 3:
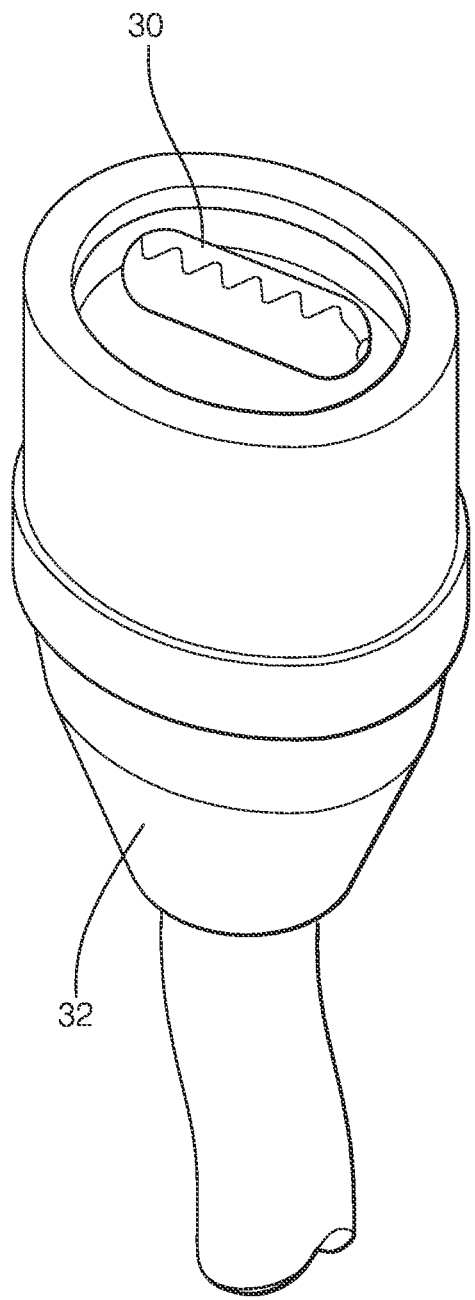
FIG. 3 is an electrical connector of the apparatus of FIG. 1 disposed within an insulative shroud according to some embodiments.

The apparatus further includes a first electrical connector 30 shown in FIG. 3 that is disposed within an insulative shroud 32 that electrically attaches the device under test 2 to the test voltage potential 26 and may further include a second electrical connector electrical 30 of the same design attaching the voltage device under test 2 to the test voltage potential 26 at a different location, e.g., an opposite end of the device under test as shown in FIG. 1. The first and second electrical connectors 30 are configured to receive an uninsulated portion of the voltage device under test 2 within the insulative shroud 32. The apparatus also includes additional electrical connectors (not shown) attaching the upper and lower ground planes to the reference potential.

Figure 4:
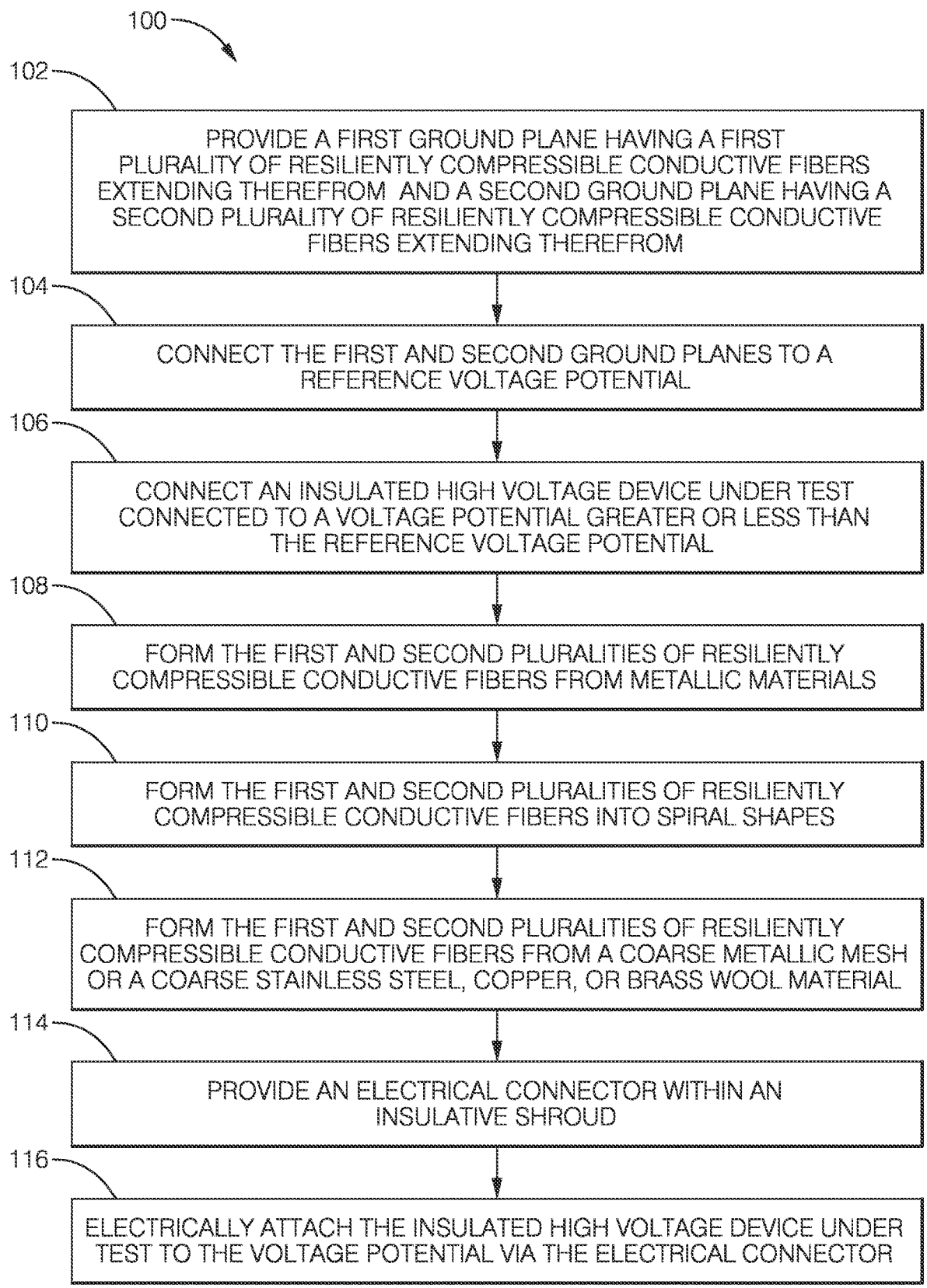
FIG. 4 is a flow chart of a method of testing high voltage devices according to according to some embodiments.

FIG. 4 shows a flow chart of a method 100 of testing insulated high voltage devices that may be applied to the test apparatus 10 described above. The method 100 includes the following steps:

STEP 102, PROVIDE A FIRST GROUND PLANE HAVING A FIRST PLURALITY OF RESILIENTLY COMPRESSIBLE CONDUCTIVE FIBERS EXTENDING THEREFROM AND A SECOND GROUND PLANE HAVING A SECOND PLURALITY OF RESILIENTLY COMPRESSIBLE CONDUCTIVE FIBERS EXTENDING THEREFROM includes providing a first and second ground plane 12, 20, each having a plurality of resiliently compressible conductive fibers 16, 22 extending therefrom;

STEP 104, CONNECT THE FIRST AND SECOND GROUND PLANES TO A REFERENCE VOLTAGE POTENTIAL, includes connecting the first and second ground planes 12, 20 to a reference voltage potential 14;

STEP 106, CONNECT AN INSULATED HIGH VOLTAGE DEVICE UNDER TEST CONNECTED TO A VOLTAGE POTENTIAL GREATER OR LESS THAN THE REFERENCE VOLTAGE POTENTIAL, includes connecting an insulated high voltage device under test 2 to a test voltage potential 26 that is greater or less than the reference voltage potential 14. The reference voltage potential 14 may be a ground potential and the test voltage potential 26 may be at least 200 volts greater than the ground potential;

STEP 108, FORM THE FIRST AND SECOND PLURALITIES OF RESILIENTLY COMPRESSIBLE CONDUCTIVE FIBERS FROM METALLIC MATERIALS, includes forming the first and second pluralities of resiliently compressible conductive fibers 16, 22 from metallic materials;

STEP 110, FORM THE FIRST AND SECOND PLURALITIES OF RESILIENTLY COMPRESSIBLE CONDUCTIVE FIBERS INTO SPIRAL SHAPES, includes forming the first and second pluralities of resiliently compressible conductive fibers 16, 22 into spiral shapes;

STEP 112, FORM THE FIRST AND SECOND PLURALITIES OF RESILIENTLY COMPRESSIBLE CONDUCTIVE FIBERS FROM A COARSE METALLIC MESH OR A COARSE STAINLESS STEEL, COPPER, OR BRASS WOOL MATERIAL, includes forming the first and second pluralities of resiliently compressible conductive fibers 16, 22 from a coarse metallic mesh or a coarse stainless steel, copper, or brass wool material;

STEP 114, PROVIDE AN ELECTRICAL CONNECTOR WITHIN AN INSULATIVE SHROUD, includes providing an electrical connector 30 disposed within an insulative shroud 32;

STEP 116, ELECTRICALLY ATTACH THE INSULATED HIGH VOLTAGE DEVICE UNDER TEST TO THE VOLTAGE POTENTIAL VIA THE ELECTRICAL CONNECTOR, includes electrically attaching the device under test 2 to the test voltage potential 26 via the electrical connector 30. The electrical connector 30 may be a first electrical connector, and the method may further include the steps providing a second electrical connector and electrically attaching the device under test 2 to the test voltage potential 26 at a different location on the device under test 2 via the second electrical connector; and The method 100 may further include the step of connecting the first ground plane 12 to the second ground plane 20 by an articulating hinge 28.

While the invention has been described with reference to an exemplary embodiment(s), it will be understood by those skilled in the art that various changes may be made, and equivalents may be substituted for elements thereof without departing from the scope of the invention. In addition, many modifications may be made to adapt a particular situation or material to the teachings of the invention without departing from the essential scope thereof. Therefore, it is intended that the invention is not limited to the disclosed embodiment(s), but that the invention will include all embodiments falling within the scope of the appended claims.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any particular order, order of operations, direction or orientation unless stated otherwise.

The invention claimed is:

1. An apparatus for testing insulated high voltage devices, comprising:
 a first ground plane connected to a reference voltage potential having a first plurality of spirally-shaped resiliently compressible conductive fibers extending therefrom; and a second ground plane connected to the reference voltage potential having a second plurality of spirally-shaped resiliently compressible conductive fibers extending therefrom, wherein the first and second ground planes are arranged to receive an insulated high voltage device under test connected to a voltage potential greater or less than the reference voltage potential between them and configured such that at least a portion of the first and second pluralities of resiliently compressible conductive fibers are in compressive contact with the insulated high voltage device under test.

2. The apparatus according to claim 1, wherein the first and second pluralities of resiliently compressible conductive fibers are formed of metallic materials.

3. The apparatus according to claim 1, wherein the first and second pluralities of resiliently compressible conductive fibers are arranged in spherical shapes.

4. The apparatus according to claim 1, wherein the first and second pluralities of resiliently compressible conductive fibers are formed of a coarse metallic mesh.

5. The apparatus according to claim 1, wherein the first and second pluralities of resiliently compressible conductive fibers form spring-like shapes.

6. The apparatus according to claim 1, wherein the first ground plane is connected to the second ground plane by an articulating hinge.

7. The apparatus according to claim 1, wherein the reference voltage potential is a ground potential and wherein the voltage potential of the insulated high voltage device under test is at least 200 volts greater than the ground potential.

8. The apparatus according to claim 1, wherein the apparatus further comprises an electrical connector electrically attaching the insulated high voltage device under test to the voltage potential that is disposed within an insulative shroud.

9. The apparatus according to claim 8, wherein the electrical connector is configured to receive an uninsulated portion of the insulated high voltage device under test within the insulative shroud.

10. The apparatus according to claim 8, wherein the electrical connector is a first electrical connector and wherein the apparatus further comprises a second electrical connector electrical attaching the insulated high voltage device under test to the voltage potential at a different location on the insulated high voltage device under test.

11. A method of testing insulated high voltage devices, comprising:
providing a first ground plane having a first plurality of resiliently compressible conductive fibers extending therefrom and a second ground plane having a second plurality of resiliently compressible conductive fibers extending therefrom;
forming the first and second pluralities of resiliently compressible conductive fibers into spiral shapes;
connecting the first and second ground planes to a reference voltage potential; and
connecting an insulated high voltage device under test connected to a voltage potential greater or less than the reference voltage potential.

12. The method according to claim 11, further comprising forming the first and second pluralities of resiliently compressible conductive fibers from metallic materials.

13. The method according to claim 11, further comprising arranging the first and second pluralities of resiliently compressible conductive fibers in spherical shapes.

14. The method according to claim 11, further comprising forming the first and second pluralities of resiliently compressible conductive fibers from a coarse metallic mesh.

15. The method according to claim 11, further comprising arranging the first and second pluralities of resiliently compressible conductive fibers into spring-like shapes.

16. The method according to claim 11, further comprising connecting the first ground plane to the second ground plane by an articulating hinge.

17. The method according to claim 11, wherein the reference voltage potential is a ground potential and wherein the voltage potential of the insulated high voltage device under test is at least 200 volts greater than the ground potential.

18. The method according to claim 11, further comprising:
providing an electrical connector within an insulative shroud; and
electrically attaching the insulated high voltage device under test to the voltage potential via the electrical connector.

19. The method according to claim 18, wherein the electrical connector is configured to receive an uninsulated portion of the insulated high voltage device under test within the insulative shroud.

20. The method according to claim 18, wherein the electrical connector is a first electrical connector and wherein the method further comprises:
providing a second electrical connector; and
electrically attaching the insulated high voltage device under test to the voltage potential at a different location on the insulated high voltage device under test via the second electrical connector.

* * * * *